United States Patent
Kitajima

(10) Patent No.: US 10,002,710 B2
(45) Date of Patent: Jun. 19, 2018

(54) CERAMIC MULTILAYER WIRING SUBSTRATE AND MODULE INCLUDING THE SAME

(71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 227 days.

(21) Appl. No.: 14/246,280

(22) Filed: Apr. 7, 2014

(65) Prior Publication Data

US 2014/0307406 A1 Oct. 16, 2014

(30) Foreign Application Priority Data

Apr. 15, 2013 (JP) .................................. 2013-084567

(51) Int. Cl.
*H01G 2/06* (2006.01)
*H05K 1/11* (2006.01)
(Continued)

(52) U.S. Cl.
CPC ......... *H01G 2/065* (2013.01); *H01F 17/0013* (2013.01); *H01F 27/292* (2013.01);
(Continued)

(58) Field of Classification Search
CPC . H01L 2924/01079; H01L 2924/01078; H01L 224/16; H01L 2224/16225;
(Continued)

(56) References Cited

U.S. PATENT DOCUMENTS 6,114,187 A * 9/2000 Hayes ................. H01L 23/3114
228/179.1
6,300,576 B1 * 10/2001 Nakamura .......... H01L 21/4853
174/261
(Continued)

FOREIGN PATENT DOCUMENTS

| JP | 3-112191 A | 5/1991 |
|---|---|---|
| JP | 10-107437 A | 4/1998 |
| JP | 2005-191134 A | 7/2005 |
| JP | 4239530 B2 | 3/2009 |

OTHER PUBLICATIONS

JPH03112191 Abstract English Translation; published in May 13, 1991.*

(Continued)

*Primary Examiner* — Pete Lee
(74) *Attorney, Agent, or Firm* — Keating & Bennett, LLP

(57) ABSTRACT

A module includes a multilayer body including laminated ceramic green sheets that have been fired, multiple mounting terminals arranged to mount a component thereon, the mounting terminals each including an end surface that is exposed at a main surface of the multilayer body, and multiple via conductors disposed inside the multilayer body so as to correspond to the mounting terminals at positions overlapped by the corresponding mounting terminals when viewed in a plan view. The lengths of the via conductors are adjusted so that predetermined points on the mounting terminals are positioned on the same plane.

21 Claims, 7 Drawing Sheets

(51) Int. Cl.
*H01F 17/00* (2006.01)
*H01F 27/29* (2006.01)
*H05K 1/03* (2006.01)
*H05K 3/34* (2006.01)

(52) U.S. Cl.
CPC .... *H05K 1/112* (2013.01); *H01L 2224/16225* (2013.01); *H01L 2924/15174* (2013.01); *H05K 1/0306* (2013.01); *H05K 1/115* (2013.01); *H05K 3/3436* (2013.01); *H05K 2201/0367* (2013.01); *H05K 2201/09427* (2013.01); *H05K 2201/09781* (2013.01); *H05K 2201/10015* (2013.01); *H05K 2201/10636* (2013.01); *Y02P 70/611* (2015.11)

(58) Field of Classification Search
CPC .......... H01L 2924/15174; H01G 2/065; H05K 1/0306; H05K 1/112; H05K 1/115; H05K 3/3436; H05K 2201/0367; H05K 2201/09427; H05K 2201/09781; H05K 2201/10015; H05K 2201/10636; H01F 17/0013; H01F 27/292; Y02P 70/611
USPC .................................. 257/737; 174/260–262
See application file for complete search history.

(56) References Cited

U.S. PATENT DOCUMENTS

| | | | | |
|---|---|---|---|---|
| 6,528,735 | B1* | 3/2003 | Bhatia | H01L 23/5382 174/260 |
| 2002/0030261 | A1* | 3/2002 | Rolda, Jr. | H01L 21/563 257/685 |
| 2005/0155791 | A1* | 7/2005 | Saiki | H01L 23/49822 174/262 |
| 2008/0185705 | A1* | 8/2008 | Osborn | H01L 23/49811 257/690 |
| 2009/0102049 | A1* | 4/2009 | Murata | H01L 23/49816 257/737 |
| 2011/0108982 | A1* | 5/2011 | Kim | H05K 3/3436 257/737 |
| 2011/0279717 | A1* | 11/2011 | Wakiyama | H01L 21/563 348/294 |
| 2012/0104596 | A1* | 5/2012 | Shah | H01L 23/50 257/737 |

OTHER PUBLICATIONS

Okamato (JPH03112191 Abstract English Translation; published in May 13, 1991).*
Official Communication issued in corresponding Japanese Patent Application No. 2013-084567, dated Apr. 7, 2015.

* cited by examiner

CERAMIC MULTILAYER WIRING SUBSTRATE AND MODULE INCLUDING THE SAME

BACKGROUND OF THE INVENTION

1. Field of the Invention

The present invention relates to a ceramic multilayer wiring substrate including a via conductor disposed therein and a module in which a component is mounted on the ceramic multilayer wiring substrate.

2. Description of the Related Art

As illustrated in FIG. 7, a module in which a component, such as an integrated circuit (IC), is flip-chip mounted on one main surface of a ceramic multilayer wiring substrate is currently known (see Japanese Unexamined Patent Application Publication No. 2005-191134, particularly, paragraphs [0036] and [0037], FIG. 1, and other portions). The module 100 includes a ceramic multilayer wiring substrate 101 and a component 103, such as an IC. The ceramic multilayer wiring substrate 101 is a multilayer body that includes laminated ceramic insulating layers 101a each including a surface on which a wiring pattern 102 is formed. The component 103 is flip-chip mounted on a first main surface of the ceramic multilayer wiring substrate 101. In addition, multiple mounting terminals 106a to 106e for allowing the component 103 to be mounted thereon are formed on the first main surface of the ceramic multilayer wiring substrate 101 while multiple external electrodes 105 for connection to external devices are formed on a second main surface of the ceramic multilayer wiring substrate 101. Inside the ceramic multilayer wiring substrate 101, multiple via conductors 104 are formed so as to connect wiring patterns 102 of different ceramic insulating layers 101a together.

A ceramic multilayer wiring substrate, such as the ceramic multilayer wiring substrate 101, is typically formed in the following manner. Firstly, multiple ceramic green sheets are prepared by forming sheets from a slurry, which is a mixture of materials, such as alumina and glass, in powder form, an organic binder, a solvent, and other components, and then forming via holes at predetermined positions of the ceramic green sheets by a method, such as laser processing. Subsequently, the via holes are filled with a conductor paste containing materials, such as Ag or Cu, to form via conductors 104 for interlayer connection and various wiring patterns 102 are printed on the sheets with the conductor paste. Thereafter, the ceramic green sheets are laminated together into a multilayer body and the multilayer body is pressed at a predetermined pressure and fired at a predetermined temperature to fabricate a ceramic multilayer wiring substrate 101.

Here, the ceramic green sheets and the via conductors 104 have different heat shrinking characteristics. For example, when the above-described multilayer body is fired, the thickness of the ceramic multilayer wiring substrate 101 may vary between the areas in which the via conductors 104 are disposed and the areas in which the via conductors 104 are not disposed when the ceramic multilayer wiring substrate 101 is viewed in a plan. Specifically, the ceramic green sheets have a higher shrinking characteristic than the via conductors 104. Thus, the sheets have a smaller thickness in the areas in which the via conductors 104 are not disposed than in the areas in which the via conductors 104 are disposed. The areas on the top surface of the ceramic multilayer wiring substrate 101 in which the via conductors 104 are disposed when viewed in a plan consequently rise. The amount by which the areas rise increases as the total length of the via conductors 104 disposed in the areas of the top surface when viewed in a plan increases.

In the existing module 100 illustrated in FIG. 7, the total length of the via conductors 104 disposed below the mounting terminal 106a (see the arrow a) at the middle among the mounting terminals 106a to 106e is longer than the total length of the via conductors 104 disposed below each of the other mounting terminals 106b to 106e (see the arrows b to e). Thus, if the ceramic multilayer wiring substrate 101 is fabricated by the above-described typical method, the middle mounting terminal 106a has a height in the stacking direction greater than heights of the other mounting terminals 106b to 106e. When, as in the above-described case, the mounting terminals 106a to 106e are not positioned on the same plane, the component 103 may be defectively mounted on the ceramic multilayer wiring substrate 101, the component 103 mounted on the ceramic multilayer wiring substrate 101 may become unstable and misaligned at the time of connection, or some of the mounting terminals 106a to 106e and the corresponding terminals of the component 103 may fail to be connected due to poor solder wettability.

SUMMARY OF THE INVENTION

Preferred embodiments of the present invention provide a ceramic multilayer wiring substrate that includes via conductors disposed inside the ceramic multilayer wiring substrate and that significantly reduces or prevents defects in mounting a component on one main surface of the ceramic multilayer wiring substrate.

A ceramic multilayer wiring substrate according to a preferred embodiment of the present invention includes a multilayer body including laminated ceramic green sheets that have been fired, at least three mounting terminals configured to mount a component thereon, the mounting terminals each including an end surface that is exposed at a first main surface of the multilayer body, and multiple via conductors disposed inside the multilayer body so as to correspond to the mounting terminals at positions overlapped by the corresponding mounting terminals when viewed in a plan view. The lengths of the via conductors are adjusted so that predetermined points on the exposed end surfaces of the mounting terminals are positioned on the same plane.

Adjustment of the lengths of the via conductors in this manner enables the predetermined points on the end surfaces of the mounting terminals exposed at the first main surface of the multilayer body to be positioned on the same plane, the mounting terminals enabling a component to be mounted thereon. In the case, for example, in which an IC including multiple external terminals, arranged in an array on the circuit surface of the IC, for connection with the ceramic multilayer wiring substrate, is used as a component and is flip-chip mounted on the ceramic multilayer wiring substrate, the external terminals of the IC are disposed on the circuit surface, that is, on the same plane. In such a case, if the predetermined points on the end surfaces of the mounting terminals on the ceramic multilayer wiring substrate are positioned on the same plane at the time of mounting the IC on the ceramic multilayer wiring substrate, the IC is mounted on the first main surface of the ceramic multilayer wiring substrate such that the plane defined by the predetermined points and the plane (circuit surface) defined by the external terminals of the IC are parallel or substantially parallel to each other. Here, the distances between the mounting terminals and the external terminals of the IC corresponding to the mounting terminals is equal or approximately equal to one another, thus significantly reducing or preventing defects in mounting the component, such as component misalignment or poor solder wettability, that can occur due to misalignment of some of the mounting terminals from the same plane.

Moreover, since the via conductors are disposed at positions overlapped by the corresponding mounting terminals when viewed in a plan view, the areas of the first main surface of the ceramic multilayer wiring substrate in which the mounting terminals are disposed rise. Here, at the time of mounting a component on the ceramic multilayer wiring substrate, the areas of the first main surface of the ceramic multilayer wiring substrate overlapped by the component when viewed in a plan view and in which the mounting terminals are not provided are lower in the stacking direction than the areas in which the mounting terminals are disposed. In these areas in which the mounting terminals are not provided, a distance between the component and the ceramic multilayer wiring substrate is increased. Thus, the space between the component and the first main surface of the ceramic multilayer wiring substrate is easily filled with an underfill resin, thus improving the efficiency with which the space is filled with the underfill resin. This configuration improves the reliability of connection between the ceramic multilayer wiring substrate and the component and significantly reduces or prevents solder splash, in which, when the solder that connects an external terminal of the component to the corresponding mounting terminal of the ceramic multilayer wiring substrate is remelted, the remelted solder flows to an adjacent mounting terminal and short-circuits the mounting terminals adjacent to each other.

The mounting terminals may preferably be arranged in a line and the lengths of the corresponding via conductors may sequentially increase in the order in which the corresponding mounting terminals are arranged. In this configuration, the mounting terminals have heights in the stacking direction that increase in the order in which the corresponding mounting terminals are arranged. Thus, when the via conductors disposed at positions overlapped by the mounting terminals when viewed in a plan have different lengths, the predetermined points on the exposed end surfaces of the mounting terminals are easily positioned on the same plane. Consequently, a ceramic multilayer wiring substrate that is less likely to include a defectively mounted component is provided.

The distance between adjacent two of the via conductors and the difference in length between the adjacent via conductors may preferably be substantially proportional to each other. This configuration enables the predetermined points on the exposed end surfaces of the mounting terminals to be reliably positioned on the same plane, thus more effectively reducing or preventing defects in mounting the component.

The lengths of the via conductors may preferably be the same or substantially the same as each other. This configuration enables the predetermined points on the exposed end surfaces of the mounting terminals to be positioned on the same plane as well as at the same height in the stacking direction, thus more effectively reducing or preventing defects in mounting the component.

At least one of the via conductors may preferably be separated into multiple separate via conductors so as to be spaced apart in a stacking direction inside the multilayer body. This configuration enables each of the separate via conductors to connect together predetermined ones of wiring electrodes of different layers disposed in the multilayer body, such that wiring electrodes (including via conductors) that are to be provided in the multilayer body can be more freely designed.

At least one of the separate via conductors may preferably be a dummy conductor that is not connected to another conductor. This configuration enables adjustment of the lengths of the via conductors using the dummy conductor of the separate via conductor so that the predetermined points on the exposed end surfaces of the mounting terminals can be positioned on the same plane. This configuration has no restriction on the length of the via conductors, such as, a restriction that a via conductor has to be lengthened in order to have a predetermined length as in the case in which one via conductor connects predetermined wiring electrodes of different layers. Thus, wiring electrodes (including via conductors) that are to be provided in the ceramic multilayer wiring substrate can be more freely designed.

At least one of the mounting terminals may preferably be an end surface of the corresponding via conductor that is exposed at the first main surface of the multilayer body. For example, in a configuration in which mounting terminals are provided on the first main surface of the ceramic multilayer wiring substrate to enable a component to be mounted thereon and connected to the via conductors disposed immediately under the mounting terminals, arranging the mounting terminals at a narrow pitch is difficult. This is because each mounting terminal is configured so as to have an area, in a plan view, larger than the area of the end surface of the corresponding one of the via conductors in view of the accuracy of the position at which the mounting terminal is disposed or the strength of connection with the component. As a result, the end surfaces of the via conductors that are exposed at the first main surface of the multilayer body are used as the mounting terminals, so that the mounting terminals can be arranged at a narrow pitch. The ceramic multilayer wiring substrate can thus be significantly reduced in size.

A module according to a preferred embodiment of the present invention includes the above-described ceramic multilayer wiring substrate and a component including multiple external terminals. The external terminals of the component are directly connected to the mounting terminals. Here, the configuration in which the external terminals of the component are directly connected to the mounting terminals is a configuration, for example, in which a component is flip-chip mounted. In such a case, the above-described mounting defects, such as component misalignment or poor solder wettability, are more likely to occur due to the difference in height of the mounting terminals in the stacking direction. In view of this, a component is mounted on the above-described ceramic multilayer wiring substrate while the external terminals of the component are directly connected to the mounting terminals of the ceramic multilayer wiring substrate. Thus, a module that is less likely to include a defectively mounted component is provided.

According to another preferred embodiment of the present invention, a ceramic multilayer wiring substrate includes a ceramic multilayer body including laminated ceramic green sheets that have been fired, at least three mounting terminals configured to mount a component thereon, the mounting terminals being disposed at a first main surface of the multilayer body, and at least three interlayer connectors disposed inside the multilayer body so as to correspond to the mounting terminals, the interlayer connectors each including a via conductor. The lengths of the via conductors of the interlayer connectors are adjusted so that the interlayer connectors are disposed at positions overlapped by the corresponding mounting terminals when viewed in a plan view and the mounting terminals are positioned on the same plane.

When, for example, a component having multiple external terminals positioned on the same plane is to be flip-chip mounted on a ceramic multilayer wiring substrate, the component, after being mounted on the ceramic multilayer wiring substrate, is disposed on the first main surface of the ceramic multilayer wiring substrate while the plane defined by the predetermined points on the end surfaces of the mounting terminals of the ceramic multilayer wiring substrate and the plane defined by the external terminals of the component are parallel or substantially parallel to each other. In this case, the distances between the mounting terminals and the external terminals of the component corresponding to the mounting terminals become equal or substantially equal to one another. This configuration significantly reduces or prevents defects in mounting the component, such as component misalignment or poor solder wettability, that can occur due to misalignment of some of the mounting terminals from the same plane.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
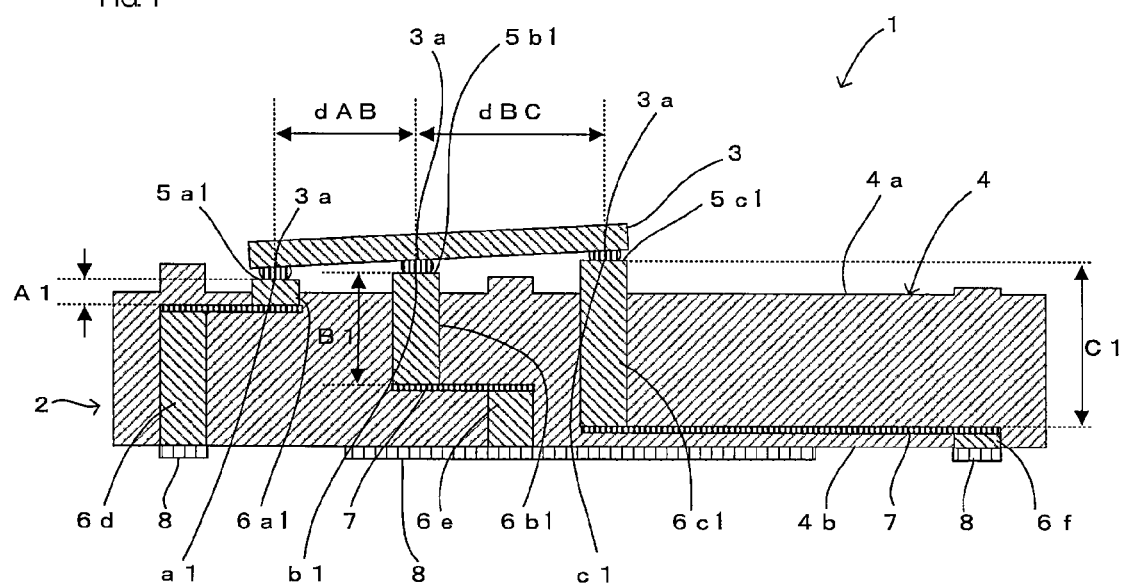
FIG. 1 is a cross-sectional view of a module according to a first preferred embodiment of the present invention.
Figure 2:
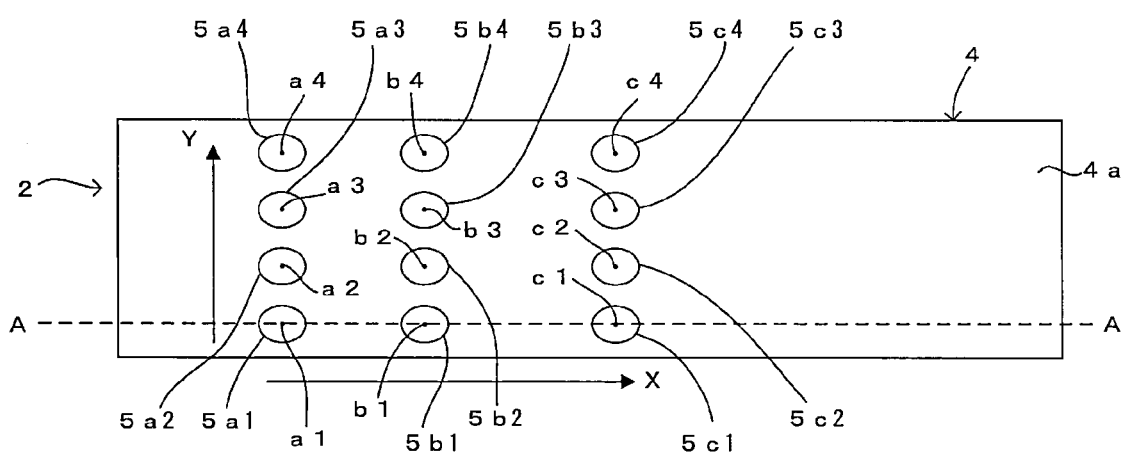
FIG. 2 is a plan view of a ceramic multilayer wiring substrate included in the module of FIG. 1.
Figure 3:
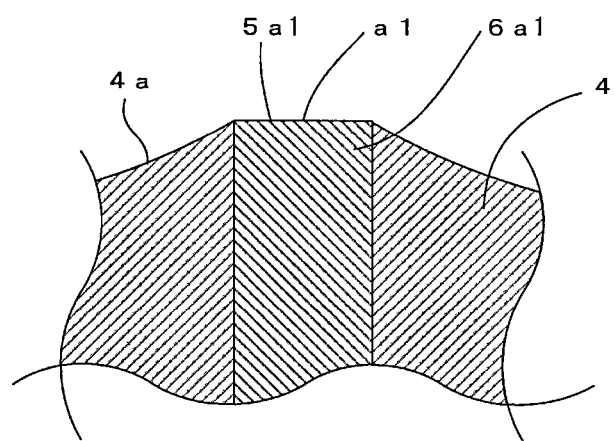
FIG. 3 is an enlarged diagram of a portion of the module of FIG. 1 viewed in a cross section.

Referring now to FIGS. 1 to 3, an example of a module 1 according to a first preferred embodiment of the present invention will be described. FIG. 1 is a cross-sectional view of a module 1 according to a first preferred embodiment, FIG. 2 is a plan view of a ceramic multilayer wiring substrate included in the module 1, and FIG. 3 is an enlarged diagram of a portion of the module 1 of FIG. 1 viewed in a cross section and illustrates a via conductor 6a1 and a portion of the multilayer body 4 surrounding the via conductor 6a1. FIG. 1 is a cross section taken along the line A-A of FIG. 2.

As illustrated in FIGS. 1 and 2, the module 1 according to the first preferred embodiment includes a ceramic multilayer wiring substrate 2 and a component 3, and defines, for example, a high-frequency circuit module.

The ceramic multilayer wiring substrate 2 includes a multilayer body 4 including multiple laminated ceramic green sheets that have been fired, multiple mounting terminals 5a1 to 5a4, 5b1 to 5b4, and 5c1 to 5c4 disposed on a first main surface 4a of the multilayer body 4 including end surfaces that are exposed to enable a component to be mounted thereon, and multiple via conductors 6a1 to 6a4, 6b1 to 6b4, and 6c1 to 6c4 disposed inside the multilayer body 4 so as to correspond to the mounting terminals 5a1 to 5a4, 5b1 to 5b4, and 5c1 to 5c4, the multiple via conductors 6a1 to 6a4, 6b1 to 6b4, and 6c1 to 6c4 being respectively disposed at positions overlapped by the corresponding mounting terminals 5a1 to 5a4, 5b1 to 5b4, and 5c1 to 5c4 when viewed in a plan view.

Inside the multilayer body 4, multiple via conductors 6d to 6f are provided at positions not overlapped by the mounting terminals 5a1 to 5a4, 5b1 to 5b4, and 5c1 to 5c4 when viewed in a plan view. Various wiring electrodes 7 are also provided in the multilayer body 4. Multiple external electrodes 8 are provided for connection to external devices on a second main surface 4b of the multilayer body 4. In this preferred embodiment, the mounting terminals 5a1 to 5a4, 5b1 to 5b4, and 5c1 to 5c4 are defined by end surfaces of the corresponding via conductors 6a1 to 6a4, 6b1 to 6b4, and 6c1 to 6c4 that are exposed at the first main surface 4a of the multilayer body 4.

A non-limiting example of a method for manufacturing the ceramic multilayer wiring substrate 2 is as follows. Firstly, multiple ceramic green sheets are prepared by forming sheets from a slurry, which is a mixture of materials, such as alumina and glass, in powder form, an organic binder, a solvent, and other components and then forming via holes at predetermined positions of the ceramic green sheets by a method such as laser processing, for example. Subsequently, the via holes are filled with a conductor paste containing materials, such as Ag or Cu, to form via conductors 6a1 to 6a4, 6b1 to 6b4, 6c1 to 6c4, and 6d to 6f for interlayer connection and various wiring electrodes 7 are printed on the sheets with the conductor paste. Thereafter, the ceramic green sheets are laminated together into a multilayer body 4 and the multilayer body 4 is pressed at a predetermined pressure and fired at a predetermined temperature to produce a ceramic multilayer wiring substrate 2.

In the case where the ceramic multilayer wiring substrate 2 is fabricated in this manner, at the time of firing the above-described multilayer body, the thickness of the ceramic multilayer wiring substrate 2 varies between the areas in which the via conductors 6a1 to 6a4, 6b1 to 6b4, 6c1 to 6c4, and 6d to 6f are disposed and the areas in which the via conductors 6a1 to 6a4, 6b1 to 6b4, 6c1 to 6c4, and 6d to 6f are not disposed when viewed in a plan view. This is because the ceramic green sheets and the via conductors 6a1 to 6a4, 6b1 to 6b4, 6c1 to 6c4, and 6d to 6f have different heat shrinking characteristics.

Specifically, the heat shrinking characteristic of the ceramic green sheets is higher than that of the via conductors 6a1 to 6a4, 6b1 to 6b4, 6c1 to 6c4, and 6d to 6f. Thus, the areas in which the via conductors 6a1 to 6a4, 6b1 to 6b4, 6c1 to 6c4, and 6d to 6f are not disposed have a smaller thickness than the areas in which the via conductors 6a1 to 6a4, 6b1 to 6b4, 6c1 to 6c4, and 6d to 6f are disposed. Consequently, the areas of the first main surface 4a of the ceramic multilayer wiring substrate 2 (multilayer body 4) in which the via conductors 6a1 to 6a4, 6b1 to 6b4, 6c1 to 6c4, and 6d to 6f are disposed when viewed in a plan view rise. The amount of the rise increases with an increase in length of the via conductors 6a1 to 6a4, 6b1 to 6b4, 6c1 to 6c4, and 6d to 6f in the areas in which the via conductors 6a1 to 6a4, 6b1 to 6b4, 6c1 to 6c4, and 6d to 6f are disposed when the first main surface 4a of the ceramic multilayer wiring substrate 2 is viewed in a plan view.

In other words, if the mounting terminals 5a1 to 5a4, 5b1 to 5b4, and 5c1 to 5c4 are end surfaces of the corresponding via conductors 6a1 to 6a4, 6b1 to 6b4, and 6c1 to 6c4 that are exposed at the first main surface 4a of the multilayer body 4, the mounting terminals 5a1 to 5a4, 5b1 to 5b4, and 5c1 to 5c4 have different heights in the stacking direction depending on the lengths of the corresponding via conductors 6a1 to 6a4, 6b1 to 6b4, and 6c1 to 6c4. In such a case, defects in mounting the component 103 may occur, as described above, the component 103 mounted on the ceramic multilayer wiring substrate 2 may become unstable and misaligned at the time of connection or some of the mounting terminals 5a1 to 5a4, 5b1 to 5b4, and 5c1 to 5c4 and the corresponding external terminals 3a of the component 3 may fail to be connected due to poor solder wettability.

Thus, in the module 1 according to the first preferred embodiment, the lengths of the via conductors 6a1 to 6a4, 6b1 to 6b4, and 6c1 to 6c4 are adjusted so that predetermined points a1 to a4, b1 to b4, and c1 to c4 at the end surfaces of the via conductors 6a1 to 6a4, 6b1 to 6b4, and 6c1 to 6c4 that are exposed at the first main surface 4a of the multilayer body 4 to define the mounting terminals 5a1 to 5a4, 5b1 to 5b4, and 5c1 to 5c4 are positioned on the same plane.

Specifically, as illustrated in FIG. 2, the mounting terminals 5a1 to 5a4, 5b1 to 5b4, and 5c1 to 5c4 are arrayed on the first main surface 4a of the multilayer body 4 into a matrix of four rows and three columns. The corresponding via conductors 6a1 to 6a4, 6b1 to 6b4, and 6c1 to 6c4 are arranged while extending in the stacking direction. For example, the via conductors 6a1 to 6c1 arranged in a column in the X direction in FIG. 2 are configured so as to sequentially increase in length in the order of the via conductor 6a1, the via conductor 6b1, and the via conductor 6c1, as illustrated in FIG. 1 (A1<B1<C1). Consequently, the mounting electrodes 5a1 to 5c1 have heights in the stacking direction that increase in the order in which the mounting terminals 5a1, 5b1, and 5c1 are arranged (5a1→5b1→5c1). Here, the predetermined points a1 to a4, b1 to b4, and c1 to c4 in this preferred embodiment are the centers of the end surfaces of the corresponding via conductors 6a1 to 6a4, 6b1 to 6b4, and 6c1 to 6c4 that are exposed at the first main surface 4a of the multilayer body 4.

In addition, the via conductors 6a1 to 6c1 are arranged so that the distance between adjacent conductors of the via conductors 6a1 to 6c1 and the difference in length between the adjacent conductors of the via conductors 6a1 to 6c1 are proportional or substantially proportional to each other. For example, the lengths of the via conductors 6a1 to 6c1 are determined so that, when the distance dAB between the via conductors 6a1 and 6b1 is the same or substantially the same as the distance dBC between the via conductors 6b1 and 6c1, the difference in length (B1−A1) between the via conductors 6a1 and 6b1 becomes the same or substantially the same as the difference in length (C1−B1) between the via conductors 6b1 and 6c1. In other words, the lengths of both via conductors 6b1 and 6c1 are determined with respect to the via conductor 6a1 such that the difference in length from the via conductor 6a1 increases as the distance from the via conductor 6a1 increases. With this configuration, the predetermined points a1 to c1 of the mounting terminals 5a1 to 5c1 are linearly or substantially linearly arranged, and the predetermined points a1 to a4, b1 to b4, and c1 to c4 of the mounting terminals 5a1 to 5a4, 5b1 to 5b4, and 5c1 to 5c4 are more likely to be positioned on the same plane.

In this preferred embodiment, the via conductors 6a1 to 6a4 arranged in a row in the Y direction of FIG. 2 preferably have the same or substantially the same length. The via conductors 6b1 to 6b4 also preferably have the same or substantially the same length and the via conductors 6c1 to 6c4 also preferably have the same or substantially the same length. The above-described relationship in length between the via conductors 6a1 to 6a4, 6b1 to 6b4, and 6c1 to 6c4 is merely exemplary and the relationship may be appropriately changed as long as the predetermined points a1 to a4, b1 to b4, and c1 to c4 are adjusted so as to be positioned on the same plane.

For example, the relationship in length between the via conductors 6a1 to 6a4 arranged in a row in the Y direction of FIG. 2 may preferably be changed so that the via conductors 6a1 to 6a4 sequentially increase in length in the order of the via conductor 6a1, the via conductor 6a2, the via conductor 6a3, and the via conductor 6a4 and, similarly, the via conductors 6b1 to 6b4 sequentially increase in length in this order and the via conductors 6c1 to 6c4 sequentially increase in length in this order. Alternatively, the relationship in length between the via conductors 6a1 to 6c1 arranged in a column in the X direction may preferably be changed so that the via conductors 6a1 to 6c1 have the same length while the via conductors in each of rows of the via conductors 6a1 to 6a4, the via conductors 6b1 to 6b4, and the via conductors 6c1 to 6c4, arranged in the direction of the Y direction sequentially increase in length.

Since the via conductors 6a1 to 6a4, 6b1 to 6b4, and 6c1 to 6c4 are disposed at positions overlapped by the corresponding mounting terminals 5a1 to 5a4, 5b1 to 5b4, and 5c1 to 5c4 when viewed in a plan view, the mounting terminals 5a1 to 5a4, 5b1 to 5b4, and 5c1 to 5c4 have heights in the stacking direction greater than a height of the first main surface 4a of the multilayer body 4 (the areas in which the via conductors 6a1 to 6a4, 6b1 to 6b4, and 6c1 to 6c4 are not disposed when viewed in a plan view), as illustrated in FIG. 1. Thus, a distance between the circuit surface on which the external terminals 3a are disposed and the areas in which the via conductors 6a1 to 6a4, 6b1 to 6b4, and 6c1 to 6c4 are not disposed can be increased, such that the space between the component 3 and the first main surface 4a of the multilayer body 4 can be efficiently filled with an underfill resin.

Preferably, the component 3 is, for example, a chip component, such as an IC, a chip capacitor, or a chip inductor, made of a material, such as Si or GaAs. The component 3 includes multiple external terminals 3a corresponding to the mounting terminals 5a1 to 5a4, 5b1 to 5b4, and 5c1 to 5c4 provided on the first main surface 4a of the multilayer body 4. In this preferred embodiment, an IC is preferably used as a component 3 and is flip-chip mounted.

In FIG. 1, in each of the via conductors 6a1 to 6c1, not only the end surface (each of the mounting terminals 5a1 to 5c1) but also a portion of the side surface of the via conductors 6a1 to 6c1 is exposed above the first main surface 4a of the multilayer body 4. Alternatively, as in the case of the via conductor 6a1 illustrated in FIG. 3, only the end surface (mounting terminal 5a1) may preferably be exposed at the first main surface 4a of the multilayer body 4. In this case, the portion of the side surface of the via conductor 6a1 exposed in FIG. 1 is surrounded by a ceramic material of the multilayer body 4 and the first main surface 4a of the multilayer body 4 gradually rises toward the side surface of the via conductor 6a1. The other via conductors 6a2 to 6a4, 6b1 to 6b4, and 6c1 to 6c4 are similarly configured.

According to the above-described preferred embodiment, the lengths of the via conductors 6a1 to 6a4, 6b1 to 6b4, and 6c1 to 6c4 are adjusted so that the predetermined points a1 to a4, b1 to b4, and c1 to c4 of the mounting terminals 5a1 to 5a4, 5b1 to 5b4, and 5c1 to 5c4 provided on the first main surface 4a of the multilayer body 4 to enable a component to be mounted thereon are positioned on the same plane.

Consequently, when the component 3 that is to be flip-chip mounted is placed on the ceramic multilayer wiring substrate 2 (multilayer body 4), the component 3 is disposed on the first main surface 4a of the ceramic multilayer wiring substrate 2 (multilayer body 4) such that the plane defined by the predetermined points a1 to a4, b1 to b4, and c1 to c4 of the mounting terminals 5a1 to 5a4, 5b1 to 5b4, and 5c1 to 5c4 provided on the first main surface 4a of the multilayer body 4 and the circuit surface of the component 3, that is, the plane defined by the external terminals 3a, is parallel or substantially parallel to each other. Thus, the distances from the mounting terminals 5a1 to 5a4, 5b1 to 5b4, and 5c1 to 5c4 to the external terminals 3a of the component 3 corresponding to the mounting terminals 5a1 to 5a4, 5b1 to 5b4, and 5c1 to 5c4 are equal or substantially equal. This configuration significantly reduces or prevents the above-described existing defects in mounting the component 3, such as misalignment of the component 3 or poor solder wettability that can occur due to misalignment of some of the mounting terminals 5a1 to 5a4, 5b1 to 5b4, and 5c1 to 5c4 from the same plane.

The mounting terminals 5a1 to 5c1 are arranged in a column (in the X direction of FIG. 2) and the predetermined points a1 to c1 of the mounting terminals 5a1 to 5c1 in the stacking direction sequentially increase in height in the order in which the mounting terminals 5a1 to 5c1 are arranged since the corresponding via conductors 6a1 to 6c1 sequentially increase in length in the order of the corresponding via conductors 6a1 to 6c1 are arranged. Thus, even when the via conductors 6a1 to 6c1 disposed at positions overlapped by the mounting terminals 5a1 to 5c1 when viewed in a plan view have different lengths, linear disposition of the predetermined points a1 to c1 of the mounting terminals 5a1 to 5c1 is facilitated, such that the predetermined points a1 to a4, b1 to b4, and c1 to c4 of the mounting terminals 5a1 to 5a4, 5b1 to 5b4, and 5c1 to 5c4 are easily positioned on the same plane. Thus, a ceramic multilayer wiring substrate 2 that is less likely to include a defectively mounted component 3 is provided.

In addition, the length of the via conductors 6a1 to 6c1 arranged in a column in the X direction of FIG. 2 are determined so that the distance between adjacent two of the via conductors 6a1 to 6c1 and the difference in length between the adjacent two of the via conductors 6a1 to 6c1 are proportional or substantially proportional to each other. Thus, the predetermined points a1 to c1 of the mounting terminals 5a1 to 5c1 are reliably positioned on a straight line, such that the predetermined points a1 to a4, b1 to b4, and c1 to c4 of the mounting terminals 5a1 to 5a4, 5b1 to 5b4, and 5c1 to 5c4 are reliably positioned on the same plane. Consequently, defects in mounting the component 3 are further effectively reduced or prevented.

In this preferred embodiment, the mounting terminals 5a1 to 5a4, 5b1 to 5b4, and 5c1 to 5c4 are the end surfaces of the corresponding via conductors 6a1 to 6a4, 6b1 to 6b4, and 6c1 to 6c4 that are exposed at the first main surface 4a of the multilayer body 4. In the case of another configuration in which mounting terminals are separately provided on the first main surface 4a of the ceramic multilayer wiring substrate 2 (multilayer body 4) and connected to the via conductors 6a1 to 6a4, 6b1 to 6b4, and 6c1 to 6c4 immediately under the mounting terminals, arranging the mounting terminals at a narrow pitch is difficult. This is because each mounting terminal is configured to have an area, in a plan view, larger than the area of the end surface of the corresponding one of the via conductors 6a1 to 6a4, 6b1 to 6b4, and 6c1 to 6c4 to accommodate for the accuracy of the position at which the mounting terminal is provided or the strength of connection with the component 3.

In view of this inconvenience, in this preferred embodiment, the end surfaces of the via conductors 6a1 to 6a4, 6b1 to 6b4, and 6c1 to 6c4 that are exposed at the first main surface 4a of the ceramic multilayer wiring substrate 2 (multilayer body 4) are used as the mounting terminals 5a1 to 5a4, 5b1 to 5b4, and 5c1 to 5c4, so that the mounting terminals 5a1 to 5a4, 5b1 to 5b4, and 5c1 to 5c4 can be disposed at a narrow pitch. Thus, the ceramic multilayer wiring substrate 2 is significantly reduced in size.

The module 1 according to this preferred embodiment is configured such that the component 3 is flip-chip mounted on the ceramic multilayer wiring substrate 2, which is more likely to cause defects in mounting the component 3 if some of the predetermined points a1 to a4, b1 to b4, and c1 to c4 of the mounting terminals 5a1 to 5a4, 5b1 to 5b4, and 5c1 to 5c4 are misaligned away from the same plane. However, the module 1 is less likely to include a defectively mounted component 3 since the lengths of the via conductors 6a1 to 6a4, 6b1 to 6b4, and 6c1 to 6c4 are adjusted so that the predetermined points a1 to a4, b1 to b4, and c1 to c4 of the mounting terminals 5a1 to 5a4, 5b1 to 5b4, and 5c1 to 5c4 of the multilayer body 4 are positioned on the same plane.

Since the via conductors 6a1 to 6a4, 6b1 to 6b4, and 6c1 to 6c4 are disposed at positions overlapped by the corresponding mounting terminals 5a1 to 5a4, 5b1 to 5b4, and 5c1 to 5c4 when viewed in a plan view, the areas of the first main surface 4a of the ceramic multilayer wiring substrate 2 in which the mounting terminals 5a1 to 5a4, 5b1 to 5b4, and 5c1 to 5c4 are disposed rise. In this case, at the time of mounting the component 3 on the ceramic multilayer wiring substrate 2, the areas within the area of the first main surface 4a of the ceramic multilayer wiring substrate 2 overlapped by the component 3 when viewed in a plan view and in which the mounting terminals 5a1 to 5a4, 5b1 to 5b4, and 5c1 to 5c4 are not disposed have a height in the stacking direction smaller than the height of the areas in which the mounting terminals 5a1 to 5a4, 5b1 to 5b4, and 5c1 to 5c4 are disposed. Thus, in these areas (the areas in which the mounting terminals 5a1 to 5a4, 5b1 to 5b4, and 5c1 to 5c4 are not disposed), a space between the component 3 and the ceramic multilayer wiring substrate 2 is increased.

This configuration facilitates filling the space between the component 3 and the first main surface 4a of the ceramic multilayer wiring substrate 2 with an underfill resin, thus improving the efficiency with which the space is filled with the underfill resin. As a result, this configuration improves the reliability of connection between the ceramic multilayer wiring substrate 2 and the component 3 and significantly reduces or prevents solder splash, in which, when the solder that connects an external terminal 3a of the component 3 to the corresponding one of the mounting terminals 5a1 to 5a4, 5b1 to 5b4, and 5c1 to 5c4 of the ceramic multilayer wiring substrate 2 is remelted, the remelted solder flows to an adjacent one of the mounting terminals 5a1 to 5a4, 5b1 to 5b4, and 5c1 to 5c4 and short-circuits the mounting terminals adjacent to each other.

Modified Example of Mounting Terminal

Figure 4:
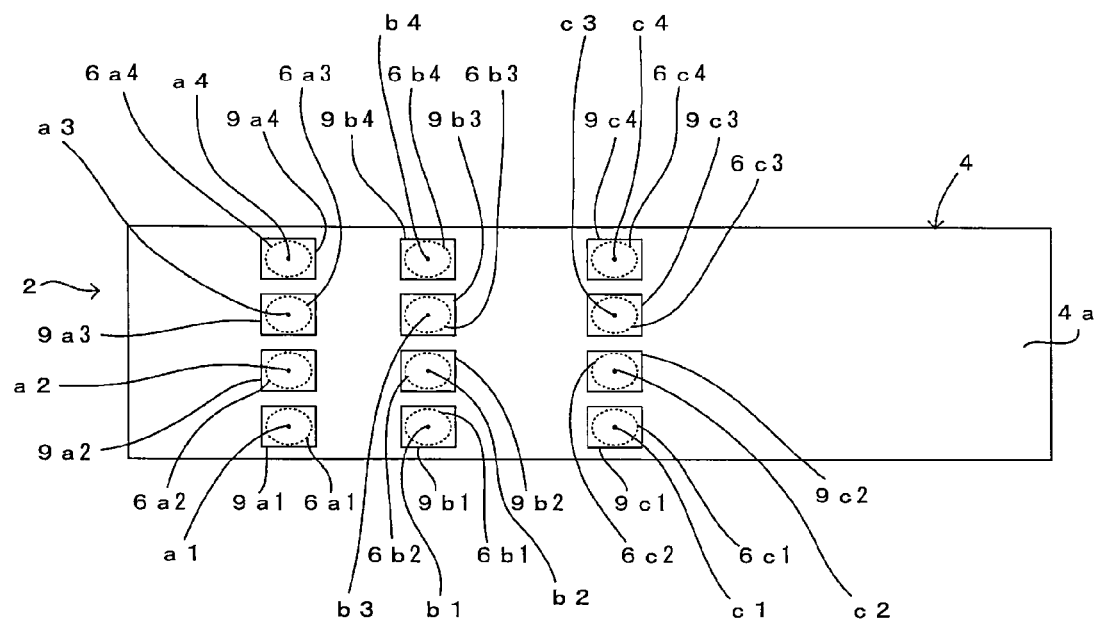
FIG. 4 illustrates mounting terminals provided on a ceramic multilayer wiring substrate according to a modified example of a preferred embodiment of the present invention.

Referring now to FIG. 4, a modified example of the mounting terminals 5a1 to 5a4, 5b1 to 5b4, and 5c1 to 5c4 according to a preferred embodiment of the present invention is described. FIG. 4 is a plan view of the ceramic multilayer wiring substrate 2 and illustrates the modified example of the mounting terminals 5a1 to 5a4, 5b1 to 5b4, and 5c1 to 5c4.

In the above described preferred embodiment, the mounting terminals 5a1 to 5a4, 5b1 to 5b4, and 5c1 to 5c4 preferably are the end surfaces of the corresponding via conductors 6a1 to 6a4, 6b1 to 6b4, and 6c1 to 6c4 that are exposed at the first main surface 4a of the multilayer body 4. However, as illustrated in FIG. 4, mounting terminals 9a1 to 9a4, 9b1 to 9b4, and 9c1 to 9c4, which each have a main surface having an area larger than the area of the end surface of each of the corresponding via conductors 6a1 to 6a4, 6b1 to 6b4, and 6c1 to 6c4, may be separately provided on the exposed end surfaces of the corresponding via conductors 6a1 to 6a4, 6b1 to 6b4, and 6c1 to 6c4.

This configuration increases the area over which each mounting terminal and the corresponding external terminal 3a of the component 3 are connected, and thus, increases the strength of connection between the component 3 and the ceramic multilayer wiring substrate 2. Here, at least one of the mounting terminals 9a1 to 9a4, 9b1 to 9b4, and 9c1 to 9c4 may be separately provided on the corresponding one of the via conductors 6a1 to 6a4, 6b1 to 6b4, and 6c1 to 6c4. In such a case, the predetermined points a1 to a4, b1 to b4, and c1 to c4 of the mounting terminals 9a1 to 9a4, 9b1 to 9b4, and 9c1 to 9c4 preferably are, as illustrated in FIG. 4, respectively positioned at the centers of the end surfaces of the via conductors 6a1 to 6a4, 6b1 to 6b4, and 6c1 to 6c4 corresponding to the mounting terminals 9a1 to 9a4, 9b1 to 9b4, and 9c1 to 9c4 that are exposed above the first main surface 4a of the multilayer body 4.

Second Preferred Embodiment

Figure 5:
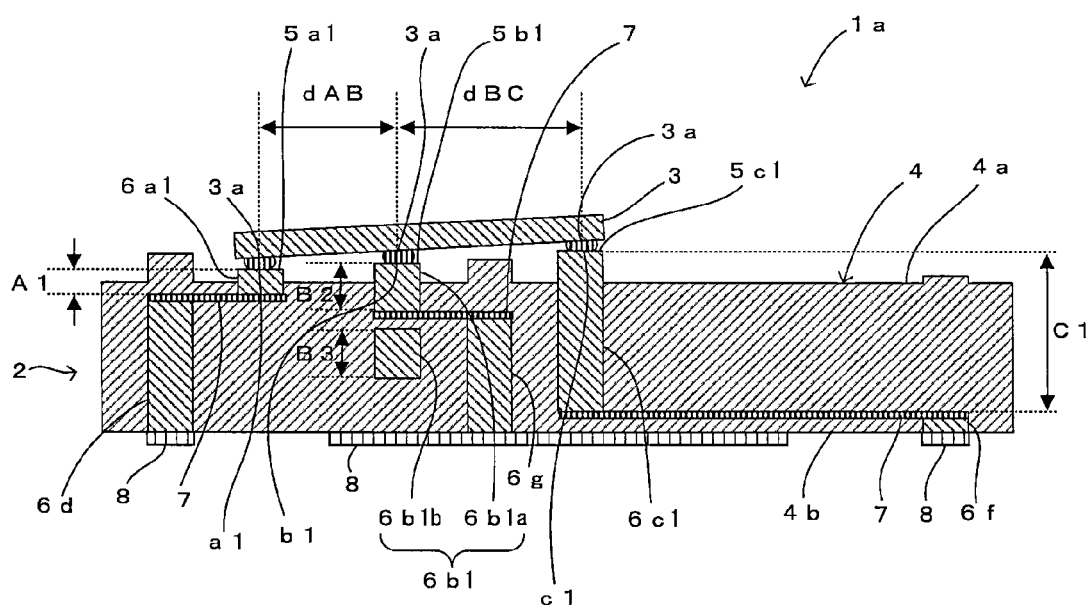
FIG. 5 is a cross-sectional view of a module according to a second preferred embodiment of the present invention.

Referring to FIG. 5, a module 1a according to a second preferred embodiment of the present invention will be described. FIG. 5 is a cross-sectional view of the module 1a.

The module 1a according to the second preferred embodiment is different from the module 1 according to the first preferred embodiment illustrated in FIG. 1 in that, as illustrated in FIG. 5, the via conductor 6b1 among the via conductors 6a1 to 6a4, 6b1 to 6b4, and 6c1 to 6c4 is separated into two separate via conductors 6b1a and 6b1b, which are spaced apart from each other in the stacking direction of the multilayer body 4. The remaining portions of this configuration preferably are the same or substantially the same as those in the module 1 according to the first preferred embodiment and are, thus, denoted by the same reference symbols without being described.

Here, the via conductor 6b1 disposed in the area overlapped by the mounting terminal 5b1 when viewed in a plan view includes two separate via conductors 6b1a and 6b1b. Among the via conductors 6d to 6f, illustrated in FIG. 1, disposed in the areas not overlapped by the mounting terminals 5a1 to 5a4, 5b1 to 5b4, and 5c1 to 5c4 when viewed in a plan view, a via conductor 6g is provided instead of the via conductor 6e. The end surface of the separate via conductor 6b1a that is exposed at the first main surface 4a of the multilayer body 4 defines the mounting terminal 5b1.

The separate via conductor 6b1a and the via conductor 6g, provided instead of the via conductor 6e, are connected together by the wiring electrode 7 disposed inside the multilayer body 4. Here, the lengths of the separate via conductors 6b1a and 6b1b are determined so that the sum of the lengths of the separate via conductors 6b1a and 6b1b is equal or substantially equal to the length B1 of the via conductor 6b1 illustrated in FIG. 1 (B1=B2+B3). The separate via conductor 6b1b is a dummy conductor that is not connected to any electrode in the multilayer body 4.

As described above, the heights of the mounting terminals 5a1 to 5a4, 5b1 to 5b4, and 5c1 to 5c4 (the predetermined points a1 to a4, b1 to b4, and c1 to c4) in the stacking direction depend on the lengths of the via conductors 6a1 to 6a4, 6b1 to 6b4, and 6c1 to 6c4 disposed at positions overlapped by the corresponding mounting terminals 5a1 to 5a4, 5b1 to 5b4, and 5c1 to 5c4 when viewed in a plan view. Thus, the lengths of the via conductors 6a1 to 6a4, 6b1 to 6b4, and 6c1 to 6c4 need to be adjusted to the above-described desired lengths in order that the predetermined points a1 to a4, b1 to b4, and c1 to c4 of the mounting terminals 5a1 to 5a4, 5b1 to 5b4, and 5c1 to 5c4 are positioned on the same plane. On the other hand, since the via conductors 6a1 to 6a4, 6b1 to 6b4, 6c1 to 6c4, 6d, 6f, and 6g function as interlayer connection conductors, restrictions on the length of the via conductors would limit the design of the various wiring electrodes 7 and the via conductors 6a1 to 6a4, 6b1 to 6b4, 6c1 to 6c, and 6d to 6g, which are disposed inside the multilayer body 4.

In view of this, this preferred embodiment is configured such that the separate via conductor 6b1b, which is not required to be disposed inside the multilayer body 4 for the original purpose, is provided as a dummy conductor so that the desired length B1 of the via conductor 6b1 can be obtained. This configuration enables a reduction of defects in mounting the component 3 with adjustment of the lengths of the via conductors 6a1 to 6a4, 6b1 to 6b4, and 6c1 to 6c4 so that the predetermined points a1 to a4, b1 to b4, and c1 to c4 of the mounting terminals 5a1 to 5a4, 5b1 to 5b4, and 5c1 to 5c4 are positioned on the same plane, while the various wiring electrodes 7 and the via conductors 6a1 to 6a4, 6b1 to 6b4, 6c1 to 6c4, 6d, 6f, and 6g, which are disposed inside the multilayer body 4, can be freely designed.

Here, the separate via conductor 6b1b does not necessarily have to be a dummy conductor and may be used for the original purpose as an interlayer connection conductor. Thus, each of the separate via conductors 6b1a and 6b1b connect predetermined wiring electrodes 7 of different layers together. Thus, the via conductors 6a1 to 6a4, 6b1 to 6b4, 6c1 to 6c4, 6d, 6f, and 6g and the various wiring electrodes 7, which are disposed inside the multilayer body 4, are more freely designed. Each of the other via conductors 6a1 to 6a4, 6b1 to 6b4, and 6c1 to 6c4 may preferably be similarly configured into separate via conductors.

Third Preferred Embodiment

Figure 6:
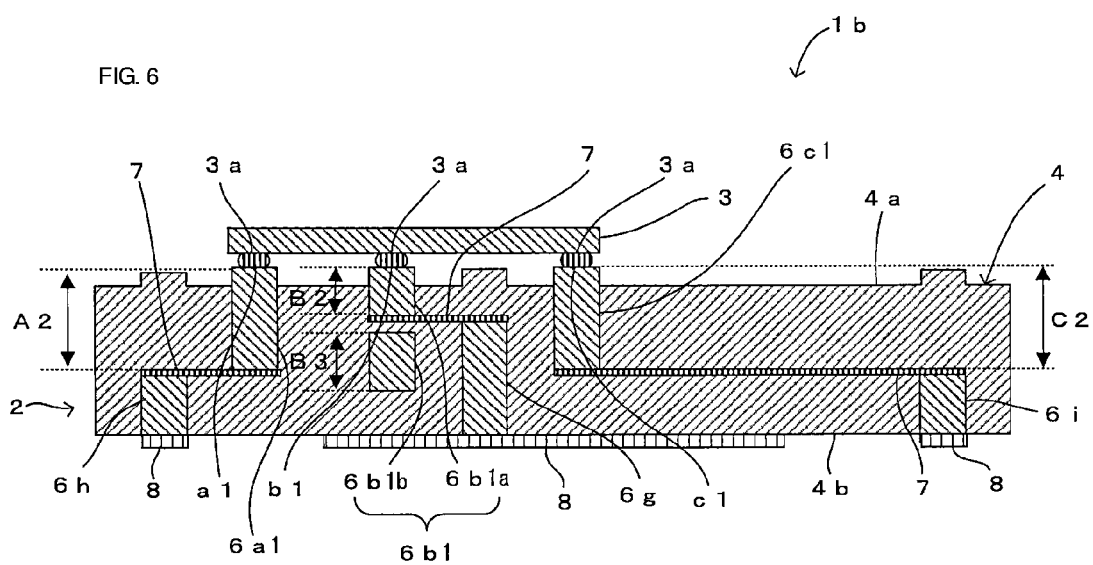
FIG. 6 is a cross-sectional view of a module according to a third preferred embodiment of the present invention.
Figure 7:
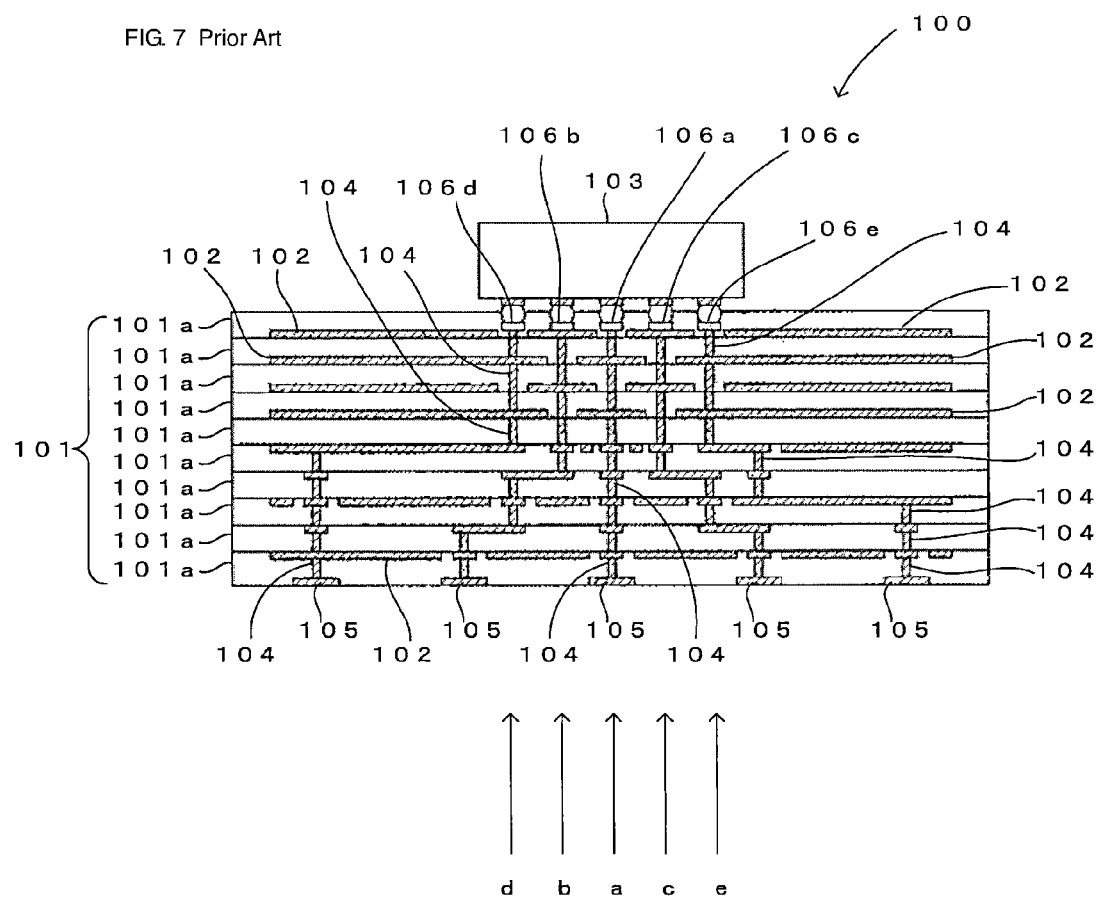
FIG. 7 is a cross-sectional view of an existing module.

Referring now to FIG. 6, a module 1b according to a third preferred embodiment of the present invention will be described. FIG. 6 is a cross-sectional view of the module 1b.

The module 1b according to the third preferred embodiment is different from the module 1a according to the second preferred embodiment illustrated in FIG. 5 in that, as illustrated in FIG. 6, the via conductors 6a1 to 6a4, 6b1 to 6b4, and 6c1 to 6c4 disposed in the areas overlapped by the corresponding mounting terminals 5a1 to 5a4, 5b1 to 5b4, and 5*c*1 to 5*c*4 when viewed in a plan view have the same or substantially the same length. Other portions of the configuration are the same or substantially the same as those in the module 1*a* according to the second preferred embodiment and, thus, are denoted by the same reference symbols without being described.

Here, the via conductors 6*a*1 to 6*a*4, 6*b*1 to 6*b*4, and 6*c*1 to 6*c*4 disposed in the areas overlapped by the mounting terminals 5*a*1 to 5*a*4, 5*b*1 to 5*b*4, and 5*c*1 to 5*c*4 when viewed in a plan view have the same or substantially the same length. For example, the via conductors 6*a*1 to 6*c*1 are configured so that, as illustrated in FIG. 6, the via conductor 6*b*1 is separated into two separate via conductors 6*b*1*a* and 6*b*1*b* as in the case of the module 1*a* according to the second preferred embodiment, and so that the sum of the lengths of the separate via conductors 6*b*1*a* and 6*b*1*b* is equal or substantially equal to the length of each of the via conductor 6*a*1 and the via conductor 6*c*1 (A2=(B2+B3)=C2). Inside the multilayer body 4, a via conductor 6*h* is provided instead of the via conductor 6*d* and a via conductor 6*i* is provided instead of the via conductor 6*f*.

This configuration enables the predetermined points a1 to a4, b1 to b4, and c1 to c4 of the mounting terminals 5*a*1 to 5*a*4, 5*b*1 to 5*b*4, and 5*c*1 to 5*c*4 to be positioned on the same plane as well as at the same or substantially the same height in the stacking direction, whereby defects in mounting the component 3 can be more effectively reduced or prevented.

The present invention is not limited to the preferred embodiments described above, and may be modified in various different manners without departing from the spirit of the present invention.

In the module 1*a* according to the second preferred embodiment, the via conductor 6*b*1 preferably is separated into two separate via conductors 6*b*1*a* and 6*b*1*b*. However, the via conductor 6*b*1 may be separated into three or more separate via conductors.

The total number of via conductors and mounting terminals disposed inside the ceramic multilayer wiring substrate 2 is appropriately changeable.

Preferred embodiments of the present invention are applicable to various types of modules in which a component is mounted on a ceramic multilayer wiring substrate including a via conductor inside.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A module comprising: a ceramic multilayer wiring substrate including: a multilayer body including a plurality of fired laminated ceramic green sheets; at least three mounting terminals configured to mount a component thereon, each of the at least three mounting terminals includes an end surface that is exposed at a main surface of the multilayer body; and a plurality of via conductors disposed inside the multilayer body so as to correspond to the at least three mounting terminals at positions overlapped by corresponding mounting terminals when viewed in a plan view; wherein lengths of the plurality of via conductors are set so that predetermined points on the exposed end surfaces of the at least three mounting terminals are positioned on a same plane; at least three mounting electrodes of the at least three mounting terminals have heights in a stacking direction of the plurality of fired laminated ceramic green sheets that increase in an order in which the at least three mounting terminals are arranged; and a chip component including a plurality of external terminals; wherein the external terminals of the chip component are directly connected to the at least three mounting terminals; and the plane defined by the predetermined points is parallel or substantially parallel to a plane defined by the external terminals of the chip component; the plurality of via conductors include a dummy via conductor; the dummy via conductor is not connected to another conductor and is disposed below one of the plurality of via conductors to maintain a predetermined length; and the predetermined length is equal to or substantially equal to a sum of the length of the dummy via conductor and the length of one of the plurality of via conductors.

2. The module according to claim 1, wherein
   the at least three mounting terminals are arranged in a line; and
   the lengths of the plurality of via conductors sequentially increase in an order in which the corresponding at least three mounting terminals are arranged.

3. The module according to claim 2, wherein a distance between two adjacent via conductors of the plurality of via conductors and a difference in length between the adjacent via conductors are proportional or substantially proportional to each other.

4. The module according to claim 1, wherein the lengths of the plurality of via conductors are the same or substantially the same.

5. The module according to claim 1, wherein at least one of the plurality of via conductors is separated into a plurality of separate via conductors in a stacking direction of the plurality of fired laminated ceramic green sheets inside the multilayer body.

6. The module according to claim 5, wherein at least one of the separate via conductors is a dummy conductor that is not connected to another conductor.

7. The module according to claim 1, wherein at least one of the at least three mounting terminals is defined by an end surface of a corresponding one of the plurality of via conductors that is exposed at the main surface of the multilayer body.

8. The module according to claim 1, wherein all of the at least three mounting terminals are defined by an end surface of corresponding ones of the plurality of via conductors that are exposed at the main surface of the multilayer body.

9. The module according to claim 1, wherein the predetermined points on the exposed end surfaces of the at least three mounting terminals are approximate centers of the exposed end surfaces.

10. The module according to claim 1, wherein the plurality of via conductors have the same or substantially the same length.

11. The module according to claim 1, wherein each of the at least three mounting terminals have heights in a stacking direction of the plurality of fired laminated ceramic green sheets greater than a height of the main surface of the multilayer body.

12. The module according to claim 1, wherein a portion of side surfaces of each of the plurality of via conductors is exposed above the main surface of the multilayer body.

13. The module according to claim 1, wherein each of the at least three mounting terminals is separately provided on an end surface of a corresponding one of the plurality of via conductors.

14. The module according to claim 13, wherein each of the at least three mounting terminals includes a main surface having an area larger than an area of the end surface of the corresponding one of the plurality of via conductors.

15. The module according to claim 1, wherein an underfill resin is filled between the main surface of the multilayer body and the chip component.

16. The module according to claim 1, wherein the chip component is one of an IC, a chip capacitor, or a chip inductor.

17. The module according to claim 1, wherein protrusions extend from the main surface of the multilayer body.

18. The module according to claim 1, wherein distances from the predetermined points to the external terminals are equal or substantially equal.

19. The module according to claim 1, wherein the multilayer body further includes wiring electrodes; and
- an extending direction of one of the wiring electrodes connected to one of the plurality of via conductors is different from an extending direction of another one of the wiring electrodes connected to another one of the plurality of via conductors.

20. The module according to claim 1, wherein a bottom surface of the chip component is flat or substantially flat when viewed in a side view of the chip component.

21. The module according to claim 1, wherein the external terminals of the chip component are directly connected to the at least three mounting terminals by solder.

* * * * *